(12) United States Patent
Tay et al.

(10) Patent No.: US 7,911,040 B2
(45) Date of Patent: Mar. 22, 2011

(54) INTEGRATED CIRCUIT PACKAGE WITH IMPROVED CONNECTIONS

(75) Inventors: Lionel Chien Hui Tay, Singapore (SG); Henry Descalzo Bathan, Singapore (SG); Zigmund Ramirez Camacho, Singapore (SG)

(73) Assignee: Stats Chippac Ltd., Sinapore (SG)

( * ) Notice: Subject to any disclaimer, the term of this patent is extended or adjusted under 35 U.S.C. 154(b) by 405 days.

(21) Appl. No.: 11/965,621

(22) Filed: Dec. 27, 2007

(65) Prior Publication Data

US 2009/0166885 A1    Jul. 2, 2009

(51) Int. Cl.
H01L 23/495    (2006.01)

(52) U.S. Cl. .............. 257/670; 257/E23.037; 257/676; 257/686; 438/123

(58) Field of Classification Search ........... 257/E21.002, 257/E23.172, 676, 686, 723, 777, 784, E23.037, 257/670; 438/109, 123; 174/52.2–52.4
See application file for complete search history.

(56) References Cited

U.S. PATENT DOCUMENTS

| | | | |
|---|---|---|---|
| 5,012,323 A * | 4/1991 | Farnworth | 257/723 |
| 6,002,181 A * | 12/1999 | Yamada et al. | 257/787 |
| 6,016,003 A | 1/2000 | Uemura | |
| 6,194,786 B1 | 2/2001 | Orcutt | |
| 6,396,136 B2 | 5/2002 | Kalidas et al. | |
| 6,414,385 B1 * | 7/2002 | Huang et al. | 257/690 |
| 6,552,416 B1 * | 4/2003 | Foster | 257/666 |
| 6,603,072 B1 * | 8/2003 | Foster et al. | 174/536 |
| 6,700,206 B2 | 3/2004 | Kinsman | |
| 6,777,264 B2 * | 8/2004 | Oka | 438/107 |
| 6,841,858 B2 * | 1/2005 | Shim et al. | 257/676 |
| 6,903,448 B1 | 6/2005 | Sutardja et al. | |
| 6,906,424 B2 * | 6/2005 | Kinsman | 257/777 |
| 7,019,389 B2 * | 3/2006 | Lai et al. | 257/666 |
| 7,141,867 B2 * | 11/2006 | Tao et al. | 257/666 |
| 7,176,487 B2 * | 2/2007 | Sakamoto et al. | 257/48 |
| 7,256,482 B2 * | 8/2007 | Kummerl et al. | 257/676 |
| 7,285,444 B2 * | 10/2007 | Danno | 438/111 |
| 7,446,400 B2 * | 11/2008 | Chen et al. | 257/673 |
| 7,459,771 B2 * | 12/2008 | Casati et al. | 257/676 |
| 7,638,862 B2 * | 12/2009 | Lam | 257/676 |
| 2006/0180904 A1 | 8/2006 | Ong | |

* cited by examiner

*Primary Examiner* — Chris Chu
(74) *Attorney, Agent, or Firm* — Mikio Ishimaru

(57) ABSTRACT

An integrated circuit package system comprising: providing an integrated circuit die; forming a top paddle over the integrated circuit die wherein the top paddle has planar dimensions smaller than planar dimensions of the integrated circuit die; forming leads adjacent the top paddle; attaching first connectors to the integrated circuit die and the top paddle; attaching second connectors to the integrated circuit die and the leads; and forming an encapsulant over the first connectors, the second connectors, the integrated circuit die, and the top paddle.

20 Claims, 8 Drawing Sheets

INTEGRATED CIRCUIT PACKAGE WITH IMPROVED CONNECTIONS

TECHNICAL FIELD

The present invention relates generally to integrated circuit packages and more particularly to a system with improved electrical connections.

BACKGROUND ART

The integrated circuit package is the building block used in a high performance electronic system to provide applications for usage in products such as wireless communications equipment, military devices, industrial robotics, spacecraft, and a vast line of high performance products from consumer to state-of-the art high performance applications. The integrated circuit such as a chip or die contains circuitry that is designed to function in a high performance electronic system.

A lead frame is commonly used inside an integrated circuit package to provide many electrical connections between the circuitry within the package and the printed circuit board within the electronic system. The circuitry within a package commonly consists of integrated circuits built onto one side, such as the top, of a piece of semiconductor material such as silicon chip or die.

The other side of a silicon chip or die, the bottom for example, is mounted or typically bonded with an electrically insulating and thermally conductive adhesive, such as epoxy onto one side of a paddle. The opposing die surface is commonly free of any circuitry components such as silicon chips or dice.

The paddle is typically a semi-rigid, electrically and thermally conductive material, used for the handling and manufacturability of the integrated circuit chip or die within the confines of the integrated circuit package. The paddle often is electrically connected to the circuitry residing on a silicon chip or die. High performance circuitry has additional critical design needs that include the requirement to have many additional grounds or many additional power connections distributed on the chip or die.

The actual physical locations of the additional grounds or power connections are selected and based on the physical and performance needs of the various circuitry contained on the chip or die. The integrated circuits can typically have two types of connections. The first connection type is the circuit signal connections used to operate and perform tasks with the electronic system. The second connection type is the circuit power and the circuit ground connections used to deliver the energy, consisting of electrical current to and from the circuitry, enabling the circuitry to operate.

There exists an industry demand for high performance chip or die circuitry needing multiple power or ground connections that are non-restrictive in physical placement. Additionally providing the benefits of smaller package geometry, simplified design rules, multiple power supply voltages or ground references are capable of providing for more power or ground package connections.

Those of ordinary skill in the art are aware of the various benefits, which include performance and power management gains that result from flexible location and quantities of power and grounds, both on the die or chip and on the physical package. Attempts have failed to provide additional power and grounds while simplifying wiring design rules, improving circuitry performance, maintaining package signal connections, lowering package heights, increasing power management, and leveraging proven manufacturing techniques.

Thus, a need still remains for integrated circuit package system with many power and ground connections. In view of the ever-increasing commercial competitive pressures, along with growing consumer expectations and the diminishing opportunities for meaningful product differentiation in the marketplace, it is critical that answers be found for these problems.

Additionally, the need to save costs, improve efficiencies and performance, and meet competitive pressures, adds an even greater urgency to the critical necessity for finding answers to these problems. Solutions to these problems have been long sought but prior developments have not taught or suggested any solutions and, thus, solutions to these problems have long eluded those skilled in the art.

DISCLOSURE OF THE INVENTION

The present invention provides an integrated circuit die; forming a top paddle over the integrated circuit die wherein the top paddle has planar dimensions smaller than planar dimensions of the integrated circuit die; forming leads adjacent the top paddle; attaching first connectors to the integrated circuit die and the top paddle; attaching second connectors to the integrated circuit die and the leads; and forming an encapsulant over the first connectors, the second connectors, the integrated circuit die, and the top paddle.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
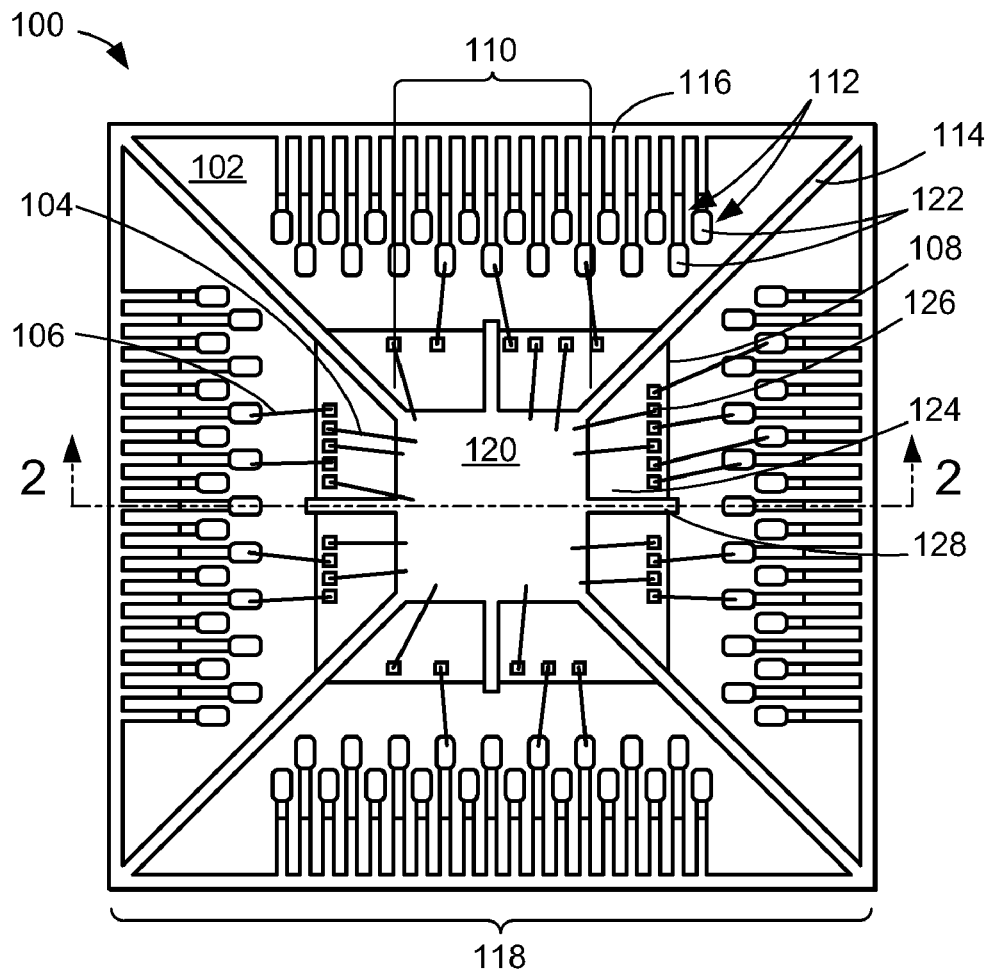
FIG. 1 is a top plan view of an integrated circuit package system in a connect phase of a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs.

Where multiple embodiments are disclosed and described, having some features in common, for clarity and ease of illustration, description, and comprehension thereof, similar and like features one to another will ordinarily be described with like reference numerals. The embodiments may be numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the invention, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "on" as used herein means and refers to direct contact among elements. The term "processing" as used herein includes deposition of material, patterning, exposure, development, etching, cleaning, and/or removal of the material or trimming as required in forming a described structure. The term "system" as used herein means and refers to the method and to the apparatus of the present invention in accordance with the context in which the term is used.

Referring now to FIG. 1, therein is shown a top plan view of an integrated circuit package system 100 in a connect phase of a first embodiment of the present invention. For illustrative purposes, the integrated circuit package system 100 is shown having an encapsulant 102 partially removed for clarity. The integrated circuit package system preferably includes the encapsulant 102, first connectors 104, and second connectors 106, an integrated circuit die 108, a top paddle 110, and leads 112.

The first connectors 104 and the second connectors 106 can be formed with the same or different material or technology. The first connectors 104 can electrically connect the integrated circuit die 108 and the top paddle 110 in a first path relative to the integrated circuit die 108. The second connectors 106 can electrically connect the integrated circuit die 108 and the leads 112 in a second path substantially different from the first path relative to the integrated circuit die 108.

Different directions or paths relative to the integrated circuit die 108 for the first connectors 104 and the second connectors 106 eliminates the need for substantially parallel locations for the first connectors 104 and the second connectors 106. The different paths also minimize overlap of the first connectors 104 and the second connectors 106. Eliminating substantially parallel locations and minimizing overlap provide a significant improvement with design rules, routing congestion, and quantity of the first connectors 104 or the second connectors 106.

The first connectors 104 or the second connectors 106 can be formed with any connector technology or any conductive material. Some technologies such as wire bonding can provide low cost and high availability as well as compatibility with space limited connection regions. For example, processes such as reverse stitch standoff bonding can also provide a significantly lower wire height and thereby a significantly lower package height.

The integrated circuit package system 100 can also include tie bars 114 connected to the top paddle 110. The leads 112 can be formed adjacent a perimeter of the top paddle 110 and connected to lead bars 116. The top paddle 110, the tie bars 114, the leads 112, and the lead bars 116 form a leadframe 118 providing structural integrity or substantially fixed positioning for processes such as mounting, bonding, or encapsulating. The lead bars 116 can be removed during further processing to separate or isolate each of the leads 112 and the top paddle 110.

The top paddle 110 can include a paddle first surface 120 such as a top surface on a same side of the leadframe 118 as a lead connection surface 122. The top paddle 110 can be formed in any shape or regions such as multiple electrically isolated regions wherein each region can provide attachment for common electrical signals or levels such as digital ground, analog ground, or any other electrical level.

For example, multiple regions of the top paddle 110 can provide two or more separate electrically isolated regions such as one region with an unswitched supply voltage for a system board as well as another region with a switched supply voltage for the system board thereby providing significantly improve power management.

The top paddle 110 can preferably be formed having planar dimensions smaller than planar dimensions of the integrated circuit die 108. Planar dimensions of the top paddle 110 can be predetermined to provide regions typically having die connections such as a perimeter region substantially exposed for various sizes of the integrated circuit die 108. The top paddle 110 can also provide substantially exposed portions of the integrated circuit die 108 having various shapes such as square or rectangular.

The integrated circuit die 108 can be attached or mounted to the leadframe 118 under the top paddle 110. A die first surface 124 such as an active side or top side of the integrated circuit die 108 can preferably be adjacent a surface opposite the paddle first surface 120. The die first surface 124 can include die pads 126 such as bond pads or die connections for electrical connectivity of the integrated circuit die 108.

The die pads 126 can be substantially exposed for electrical connectivity due to the top paddle 110 having smaller planar dimensions than planar dimensions of the integrated circuit die 108. The die pads 126 can commonly be formed in a region such as a perimeter region of the integrated circuit die 108 substantially exposed from the top paddle 110 commonly attached over the integrated circuit die 108 in a substantially central location.

Optionally, top paddle extensions 128 can be formed adjacent or connected to the top paddle 110. The top paddle extensions 128 can provide improved mounting, locating, positioning, or connectivity for components such as the integrated circuit die 108. The top paddle extensions 128 can also provide electrical connectivity for the top paddle 110.

For illustrative purposes, the top paddle extensions 128 are shown in a shape of a bar or elongated rectangular prism extending from each of four sides of the top paddle 110 although it is understood that the top paddle extensions 128 are optional and may have any shape, size, location, or position.

It has been unexpectedly discovered that the integrated circuit package system 100 with the top paddle 110 and substantially different directions for adjacent of the first connectors 104 and the second connectors 106, provides significantly simplified design rules and significantly reduced routing congestion thereby resulting in significant improvement for quality and quantity of electrical connections.

Figure 2:
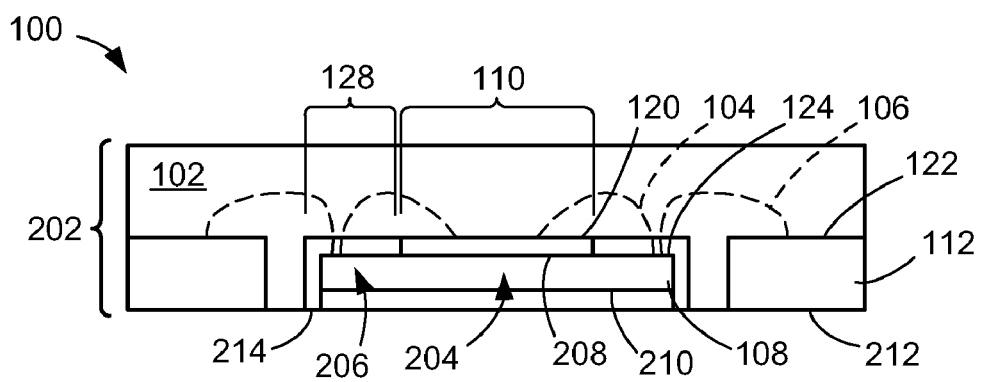
FIG. 2 is a cross-sectional view of the integrated circuit package system along line 2-2 of FIG. 1.

Referring now to FIG. 2, therein is shown a cross-sectional view of the integrated circuit package system 100 along line 2-2 of FIG. 1. The integrated circuit package system 100 includes the encapsulant 102 formed over the first connectors 104 attached to the integrated circuit die 108 and the paddle first surface 120 of the top paddle 110 or the second connectors 106 attached to the integrated circuit die 108 and the lead connection surface 122 of the leads 112. The encapsulant 102 over the integrated circuit die 108, the top paddle 110, and the leads 112 can form a package 202 such as a component in a system or an internal stacking module.

The top paddle 110 can be formed having a top paddle recess 204 with the integrated circuit die 108 attached or mounted in the top paddle recess 204 partially or fully therein. The top paddle extensions 128 can also include a recess such as a pad extension recess 206 for mounting a portion of the integrated circuit die 108. The top paddle recess 204 and optionally the pad extension recess 206 can be formed having a depth substantially smaller than a thickness of the leads 112 and having an opening predetermined to provide spacing for a thickness of the integrated circuit die 108.

A pad second surface 208 such as a back side or die attach surface on a side opposite the paddle first surface 120 can provide a surface for attaching or mounting the die first surface 124 of the integrated circuit die 108. The pad second surface 208 can preferably form an extent of the top paddle recess 204 providing spacing greater than or equal to a thickness of the integrated circuit die 108 and optionally a die attach layer (not shown).

The integrated circuit die 108 can include a die second surface 210 such as a back side or non-active surface on a side opposite the die first surface 124. The die second surface 210 can commonly provide a surface without active circuitry and can commonly conduct an electrical level such as ground. The die second surface 210 can optionally be enclosed in the top paddle recess 204 by the encapsulant 102.

The encapsulant 102 can also provide a lead external surface 212 of the leads 112 substantially exposed for external electrical connectivity. Exposed portions of the leads 112 such as the lead external surface 212 can provide connectivity to a next level system such as another package or a printed circuit board.

Similarly, the encapsulant 102 can also optionally provide an extension external surface 214 of the top paddle extensions 128 substantially exposed for electrical connectivity. Optional exposed portions of the top paddle extensions 128 such as the extension external surface 214 can also provide connectivity to a next level system.

Figure 3:
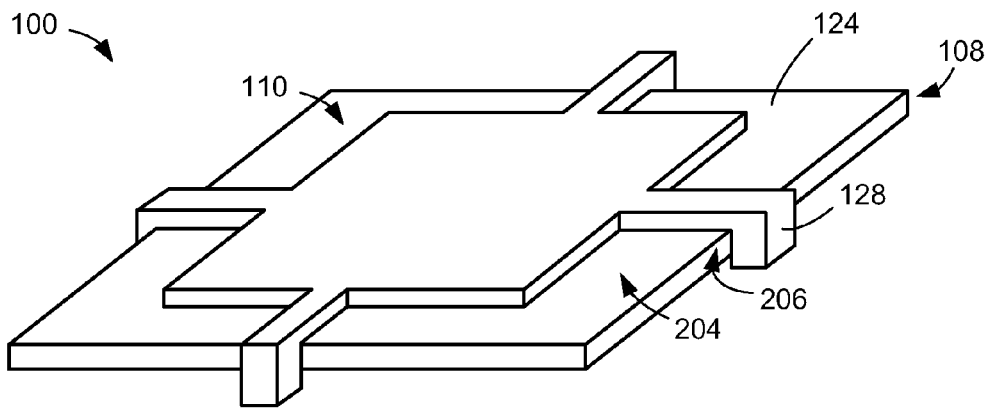
FIG. 3 is an isometric view of a portion of the integrated circuit package system in a die mounting phase.

Referring now to FIG. 3, therein is shown an isometric view of a portion of the integrated circuit package system 100 in a die mounting phase. The top paddle 110 is shown over the die first surface 124 of the integrated circuit die 108. The pad extension recess 206 provides spacing for the integrated circuit die 108 under the top paddle 110 having the top paddle recess 204 of FIG. 2 and the top paddle extensions 128.

The integrated circuit die 108 can be attached or mounted to the top paddle 110 or the top paddle extensions 128 and in the top paddle recess 204 or the pad extension recess 206. A portion of the top paddle extensions 128 can be formed adjacent an outer edge or perimeter of the integrated circuit die 108 to optionally provide support such as locating, positioning or partial enclosing of the integrated circuit die 108.

Figure 4:
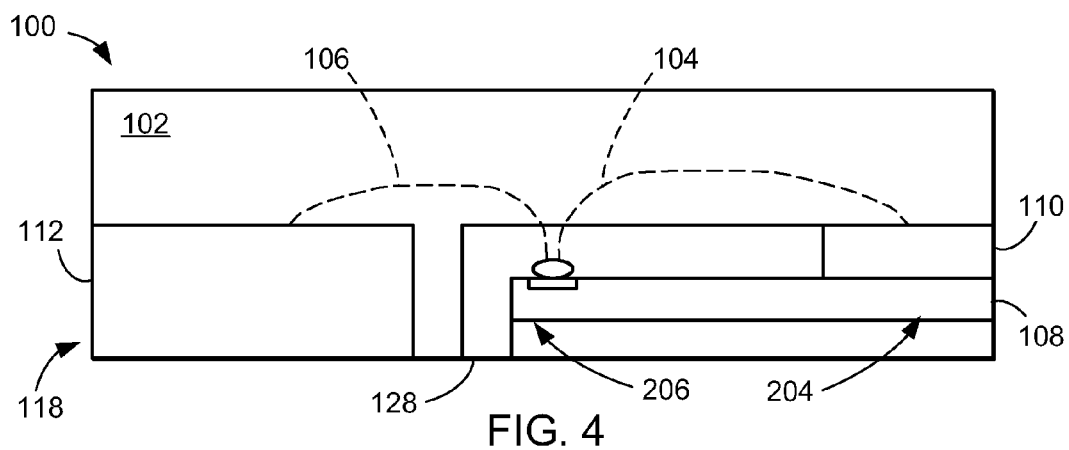
FIG. 4 is a cross-sectional view of a portion of the integrated circuit package system.

Referring now to FIG. 4, therein is shown a cross-sectional view of a portion of the integrated circuit package system 100. The top paddle 110 is shown over the integrated circuit die 108. The second connectors 106 are shown connecting the integrated circuit die 108 and the leads 112 in one direction and the first connectors 104 connecting the integrated circuit die 108 and the top paddle 110 in a substantially different direction. The integrated circuit package system 100 can provide a very low profile package such as an internal stacking module.

For example, the top paddle recess 204 or the pad extension recess 206 can be formed having a height of approximately five mils or less of approximately eight mils of height for the leadframe 118 of FIG. 1. The first connectors 104 or the second connectors 106 can be formed having a loop height of five mils or less resulting in a height over the leadframe 118 of approximately two mils or less. With a mold clearance over the first connectors 104 or the second connectors 106 of three mils or less, the overall height of the integrated circuit package system 100 can be thirteen mils or less.

Figure 5:
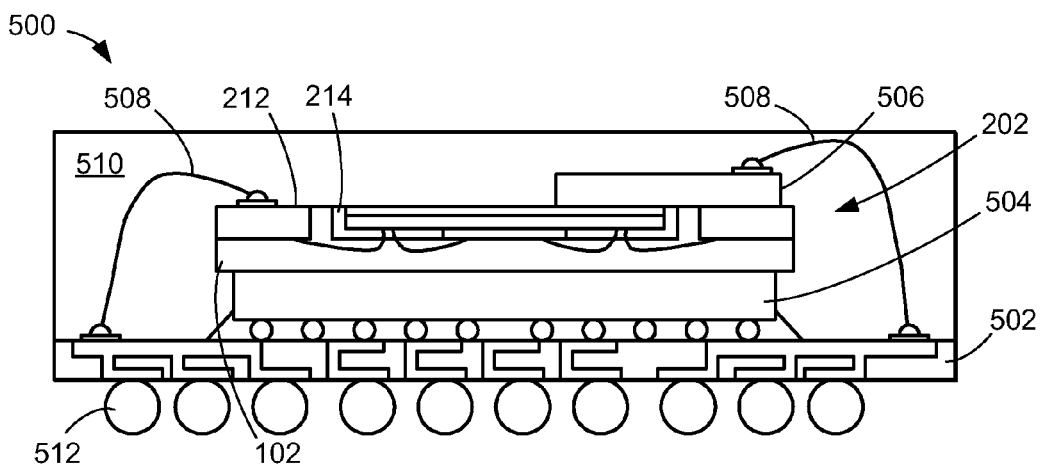
FIG. 5, is a cross-sectional view of an integrated circuit package system in a second embodiment of the present invention.

Referring now to FIG. 5, therein is shown a cross-sectional view of an integrated circuit package system 500 in a second embodiment of the present invention. The integrated circuit package system 500 preferably includes a base substrate 502 and a base device 504 such as a flip clip. The package 202 such as an internal stacking module can be attached or mounted over the base device 504 and the base substrate 502.

The encapsulant 102 of the package 202 can be mounted over the base device 504 providing the lead external surface 212 and the extension external surface 214 substantially exposed during assembly. The lead external surface 212 and the extension external surface 214 can provide connectivity for interconnects 508 or other components.

Other components such as a second device 506 can also be included. The second device 506 such as an integrated circuit die can be mounted over the package 202 and electrically connected to the base substrate 502 with the interconnects 508. The interconnects 508 can also electrically connect the package 202 to the base substrate 502.

A package-in-package encapsulant 510 can be applied over a portion of the base substrate 502, the base device 504, the package 202, the interconnects 508, and the second device 506. The package-in-package encapsulant 510 can provide protection or structural integrity for components of the integrated circuit package system 500.

Package connectors 512 such as solder balls can be formed on the base substrate 502 preferably over a side opposite the base device 504. The package connectors 512 can provide electrical connectivity to a next level system such as another package or a printed circuit board.

Figure 6:
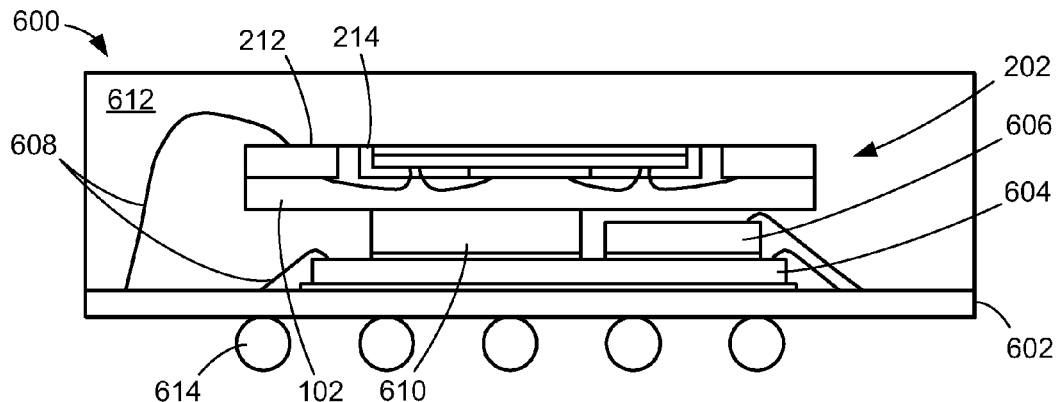
FIG. 6, is a cross-sectional view of an integrated circuit package system in a third embodiment of the present invention.
Figure 7A:
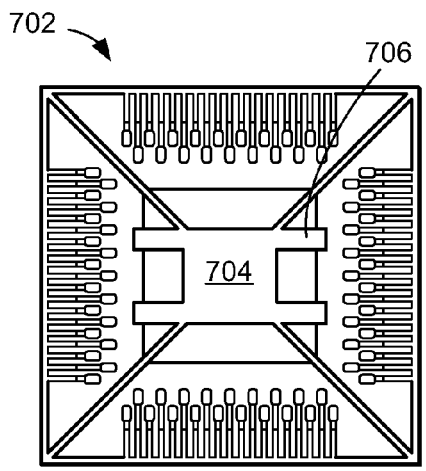
FIGS. 7A, 7B, 7C, and 7D are top plan views of die attach pad variation examples in an encapsulation phase of the present invention.
Figure 7B:
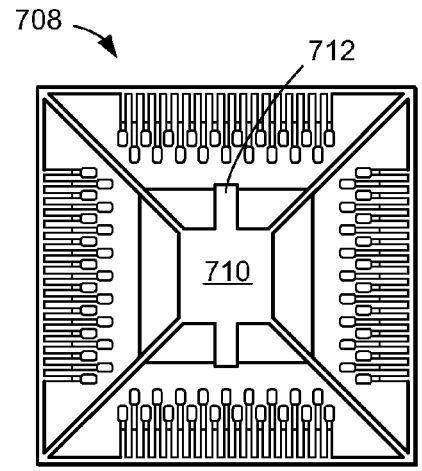
Figure 7C:
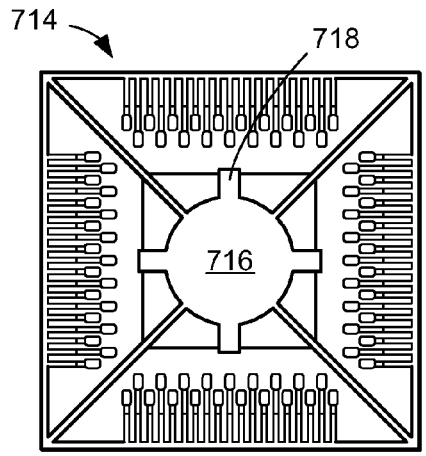
Figure 7D:
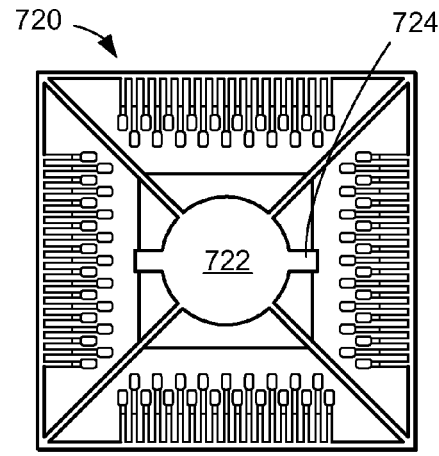

Referring now to FIG. 6, therein is shown a cross-sectional view of an integrated circuit package system 600 in a third embodiment of the present invention. The integrated circuit package system 600 preferably includes a base substrate 602 and a base device 604 such as a wirebonded device. The package 202 such as an internal stacking module can be attached or mounted over the base device 604 and the base substrate 602.

Other components such as a stack device 606 can also be included. The stack device 606 such as an integrated circuit die can be mounted over the base device 604 and electrically connected to the base substrate 602 with interconnects 608. The interconnects 608 can also electrically connect the package 202 to the base substrate 602.

Optionally a spacer 610 such as a fill layer or material providing a spacing predetermined to include components or connections such as the stack device 606 and the interconnects 608 attached thereover. The spacer 610 can optionally be formed over the base device 604 and adjacent the stack device 606.

The encapsulant 102 of the package 202 can be mounted over the stack device 606 and the spacer 610 providing the lead external surface 212 and the extension external surface 214 substantially exposed during assembly. The lead external surface 212 and the extension external surface 214 can provide connectivity for the interconnects 608 or other components.

A package-in-package encapsulant 612 can be applied over a portion of the base substrate 602, the base device 604, the package 202, the interconnects 608, and the stack device 606. The package-in-package encapsulant 612 can provide protection or structural integrity for components of the integrated circuit package system 600.

Package connectors 614 such as solder balls can be formed on the base substrate 602 preferably over a side opposite the base device 604. The package connectors 614 can provide electrical connectivity to a next level system such as another package or a printed circuit board.

Referring now to FIGS. 7A, 7B, 7C, and 7D therein are shown top plan views of die attach pad variation examples in an encapsulation phase of the present invention. For illustrative purposes, integrated circuit package systems 702, 708, 714, and 720 are shown without interconnect and encapsulation partially removed for clarity.

In a fourth embodiment of the present invention, the integrated circuit package system 702 includes a top paddle 704 having top paddle extensions 706. The top paddle 704 can be formed in a shape of a rectangle having two of the top paddle extensions 706 on one side and two more of the top paddle extensions 706 on an opposite side. Two of the top paddle extensions 706 on opposite sides can be adjacent an upper edge of the top paddle 704. The other two of the top paddle extensions 706 on opposite sides can be adjacent a lower edge of the top paddle 704.

In a fifth embodiment of the present invention, the integrated circuit package system 708 includes a top paddle 710 having top paddle extensions 712. The top paddle 710 can be formed in a shape of a rectangle with one of the top paddle extensions 712 formed on a side of the top paddle 710 opposite a side having a second of the top paddle extensions 712.

In a sixth embodiment of the present invention, the integrated circuit package system 714 includes a top paddle 716 having top paddle extensions 718. The top paddle 716 can be formed in a shape of an ellipse with four of the top paddle extensions 718 formed on a perimeter of the top paddle 716. Each of the top paddle extensions 718 can be formed at approximately ninety degrees from an adjacent of the top paddle extensions 718.

In a seventh embodiment of the present invention, the integrated circuit package system 720 includes a top paddle 722 having top paddle extensions 724. The top paddle 722 can be formed in a shape of an ellipse with two of the top paddle extensions 724 formed on opposite sides of the top paddle 722. The top paddle extensions 724 can be formed at approximately one hundred eighty degrees from each other.

Figure 8:
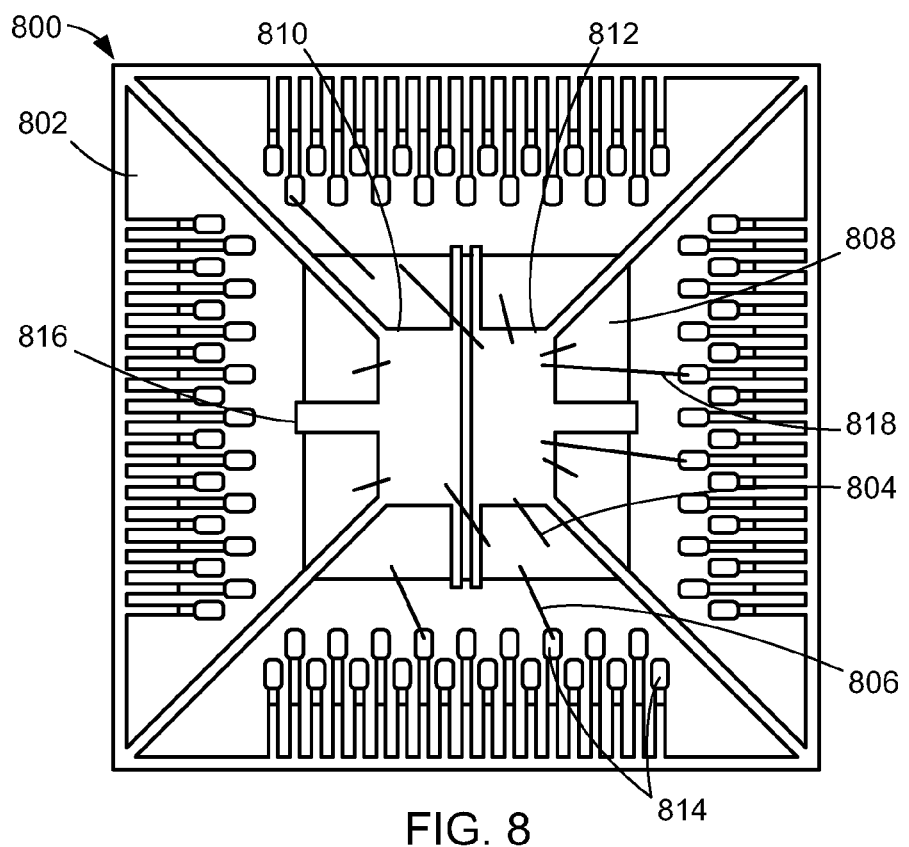
FIG. 8, is a top plan view of an integrated circuit package system in an encapsulation phase of an eighth embodiment of the present invention.

Referring now to FIG. 8, therein is shown a top plan view of an integrated circuit package system 800 in an encapsulation phase of an eighth embodiment of the present invention. For illustrative purposes, the integrated circuit package system 800 is shown having an encapsulant 802 partially removed for clarity. The integrated circuit package system preferably includes the encapsulant 802, first connectors 804, and second connectors 806.

The first connectors 804 can electrically connect an integrated circuit die 808 to a first top paddle 810 or a second top paddle 812 adjacent the first top paddle 810. The second connectors 806 can electrically connect the integrated circuit die 808 to leads 814. The leads 814 can optionally be formed in inner and outer rows adjacent the first top paddle 810 and the second top paddle 812.

For example, the first top paddle 810 can be electrically connected to an electrical level such as ground and the second top paddle 812 can be electrically connected an electrical level such as power. The first connectors 804 can connect portions of the integrated circuit die 808 to a ground through the first top paddle 810 and to power through the second top paddle 812.

Top paddle extensions 816 can optionally be formed outer edges of the first top paddle 810 or the second top paddle 812. The top paddle extensions 816 can be formed near opposite edges of the integrated circuit die 808 providing mounting, locating, positioning, or connecting components such as the integrated circuit die 808.

Optionally die paddle connectors 818 can connect the first top paddle 810 or the second top paddle 812 to the leads 814. A limited number of the die paddle connectors 818 can preferably be used for direct connection of the leads 814 to the first top paddle 810 or the second top paddle 812 for improved signal or electrical level quality.

Figure 9:
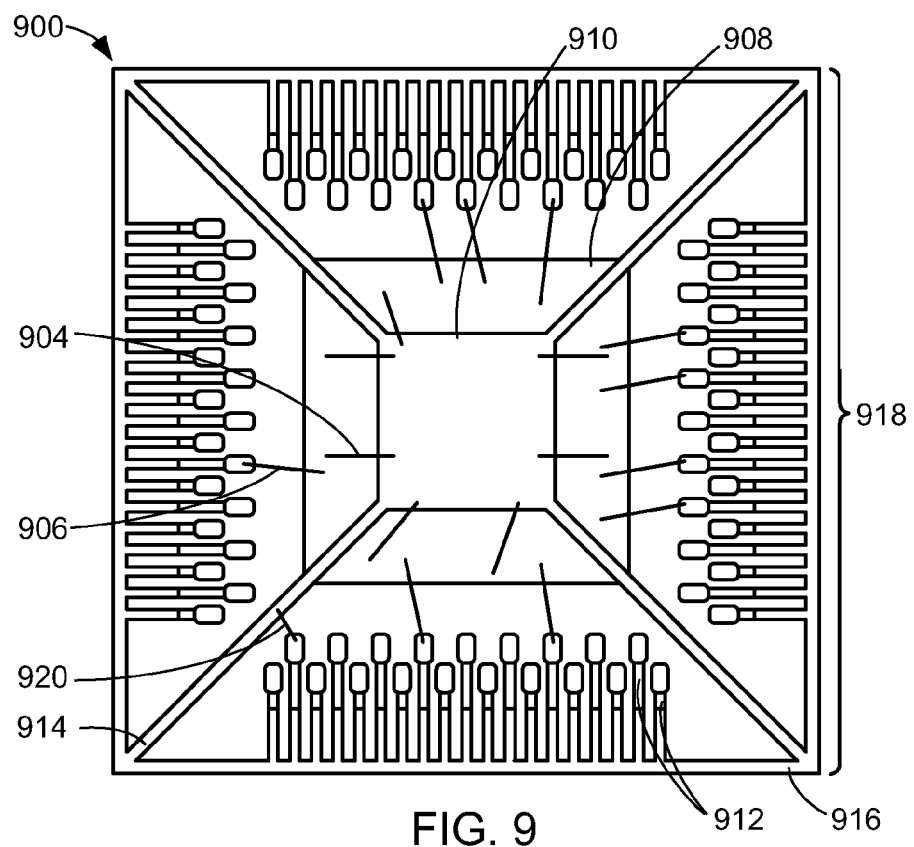
FIG. 9, is a top plan view of an integrated circuit package system in a connection phase of a ninth embodiment of the present invention.

Referring now to FIG. 9, therein is shown a top plan view of an integrated circuit package system 900 in a connection phase of a ninth embodiment of the present invention. The integrated circuit package system 900 preferably includes first connectors 904 and second connectors 906.

The first connectors 904 electrically connect an integrated circuit die 908 to a top paddle 910 and the second connectors 906 electrically connect the integrated circuit die 908 to leads 912. The leads 912 can optionally be formed in inner and outer rows adjacent the top paddle 910 formed in a shape of a rectangle.

The integrated circuit package system 900 can also include tie bars 914 connected to the top paddle 910. The leads 912 can be connected to lead bars 916. The top paddle 910, the tie bars 914, the leads 912, and the lead bars 916 form a leadframe 918 providing structural integrity or substantially fixed positioning.

A die paddle connector 920 such as a bond wire can electrically connect the tie bars 914 to the leads 912 thereby providing an electrical level such as ground to the top paddle 910 without the need for the top paddle extensions 128 of FIG. 1.

Figure 10:
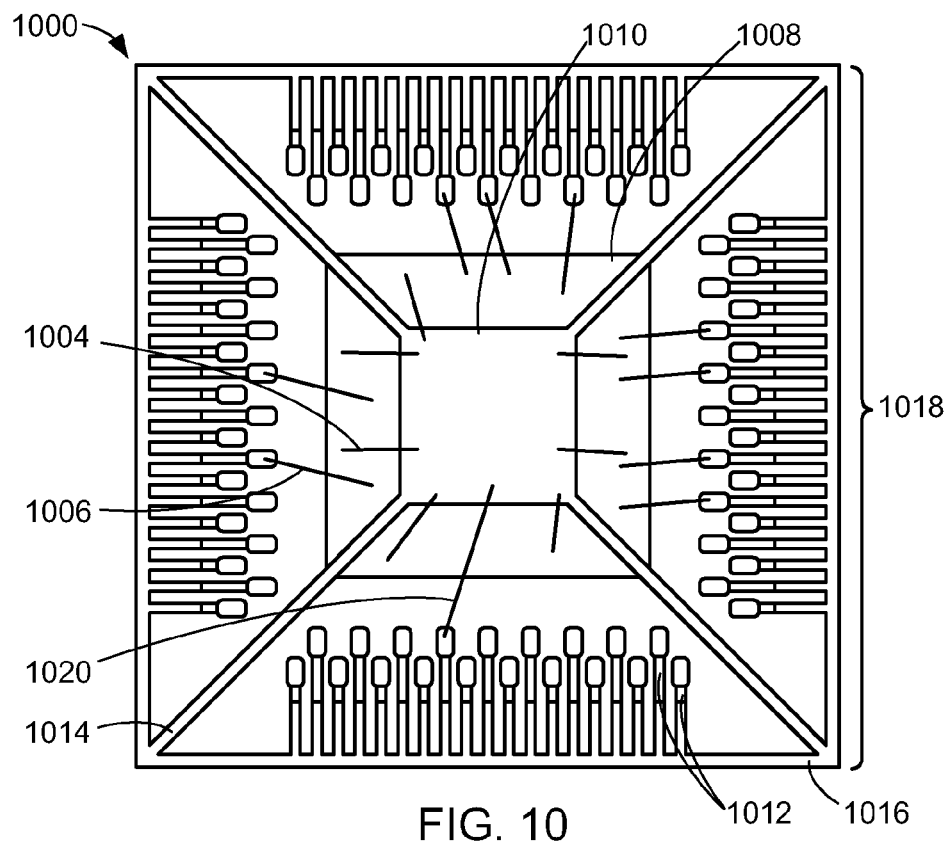
FIG. 10, is a top plan view of an integrated circuit package system in a connection phase of a tenth embodiment of the present invention.

Referring now to FIG. 10, therein is shown a top plan view of an integrated circuit package system 1000 in a connection phase of a tenth embodiment of the present invention. The integrated circuit package system 1000 preferably includes first connectors 1004 and second connectors 1006.

The first connectors 1004 electrically connect an integrated circuit die 1008 to a top paddle 1010 and the second connectors 1006 electrically connect the integrated circuit die 1008 to leads 1012. The leads 1012 can optionally be formed in inner and outer rows adjacent the top paddle 1010 formed in a shape of a rectangle.

The integrated circuit package system 1000 can also include tie bars 1014 connected to the top paddle 1010. The leads 1012 can be connected to lead bars 1016. The top paddle 1010, the tie bars 1014, the leads 1012, and the lead bars 1016 form a leadframe 1018 providing structural integrity or substantially fixed positioning.

A die paddle connector 1020 such as a bond wire can electrically connect the top paddle 1010 directly to the leads 1012 thereby providing an electrical level such as ground to the top paddle 1010 without the need for the top paddle extensions 128 of FIG. 1.

Figure 11:
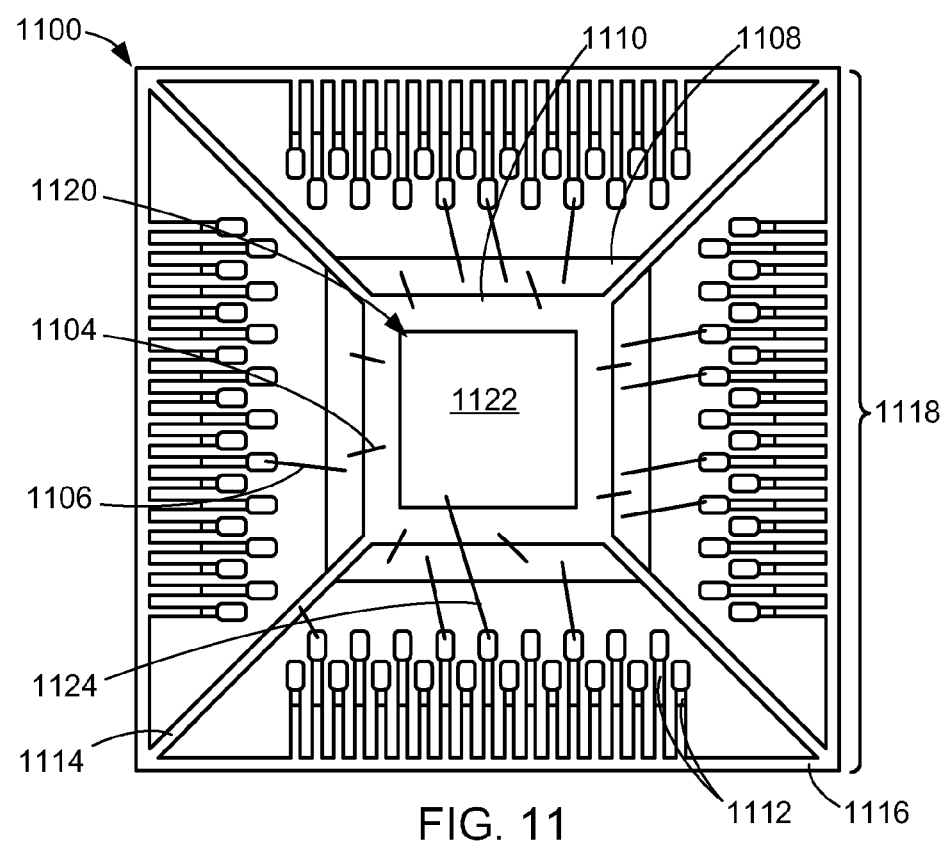
FIG. 11, is a top plan view of an integrated circuit package system in a connection phase of an eleventh embodiment of the present invention.

Referring now to FIG. 11, therein is shown a top plan view of an integrated circuit package system 1100 in a connection phase of an eleventh embodiment of the present invention. The integrated circuit package system 1100 preferably includes first connectors 1104 and second connectors 1106.

The first connectors 1104 electrically connect a base integrated circuit die 1108 to a top paddle 1110 and the second connectors 1106 electrically connect the base integrated circuit die 1108 to leads 1112. The leads 1112 can optionally be formed in inner and outer rows adjacent the top paddle 1110 formed in a shape of a rectangle.

The integrated circuit package system 1100 can also include tie bars 1114 connected to the top paddle 1110. The leads 1112 can be connected to lead bars 1116. The top paddle 1110, the tie bars 1114, the leads 1112, and the lead bars 1116 form a leadframe 1118 providing structural integrity or substantially fixed positioning.

A top paddle opening 1120 can be formed in the top paddle 1110 providing spacing for a top integrated circuit die 1122. The top paddle opening 1120 can preferably provide an opening through the top paddle 1110. The top integrated circuit die 1122 can be attached or mounted partially in the top paddle opening 1120 and over the base integrated circuit die 1108.

Top die connectors 1124 such as a bond wires can electrically connect the top integrated circuit die 1122 to the top paddle 1110 or the leads 1112. The top die connectors 1124 can be formed with the same or different technology or material as the first connectors 1104 or the second connectors 1106.

Figure 12:
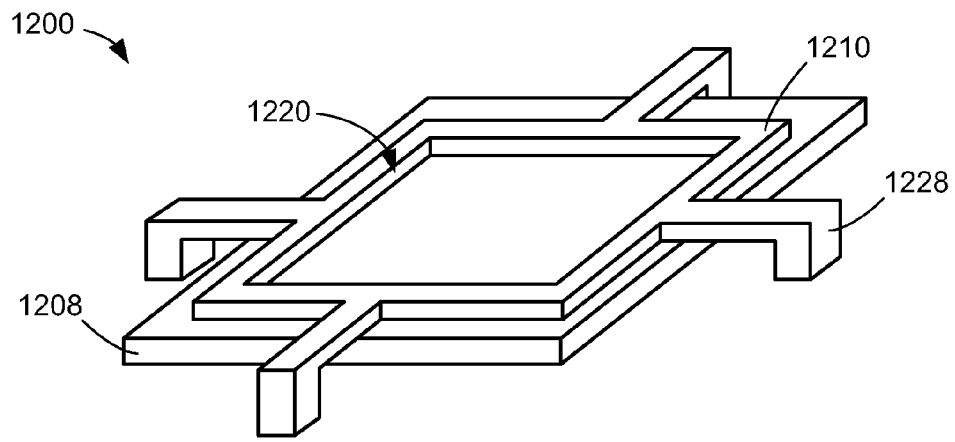
FIG. 12, is an isometric view of an integrated circuit package system in a mounting phase of a twelfth embodiment of the present invention.

Referring now to FIG. 12, therein is shown an isometric view of an integrated circuit package system 1200 in a mounting phase of a twelfth embodiment of the present invention. Similar to the integrated circuit package system 1100, the integrated circuit package system 1200 preferably includes a base integrated circuit die 1208 and a top paddle 1210 with a top paddle opening 1220, and top paddle extensions 1228.

The top paddle 1210 can be attached or mounted over the base integrated circuit die 1208 wherein the base integrated circuit die 1208 can partially exposed through the top paddle opening 1220. The base integrated circuit die 1208 can also be attached or mounted adjacent the top paddle extensions 1228 and partially within the top paddle extensions 1228.

The top paddle 1210 including the top paddle opening 1220 preferably provides an opening through the top paddle 1210. The top paddle opening 1220 can provide spacing for attaching or mounting other components over the base integrated circuit die 1208 and partially in the top paddle opening 1220.

Figure 13:
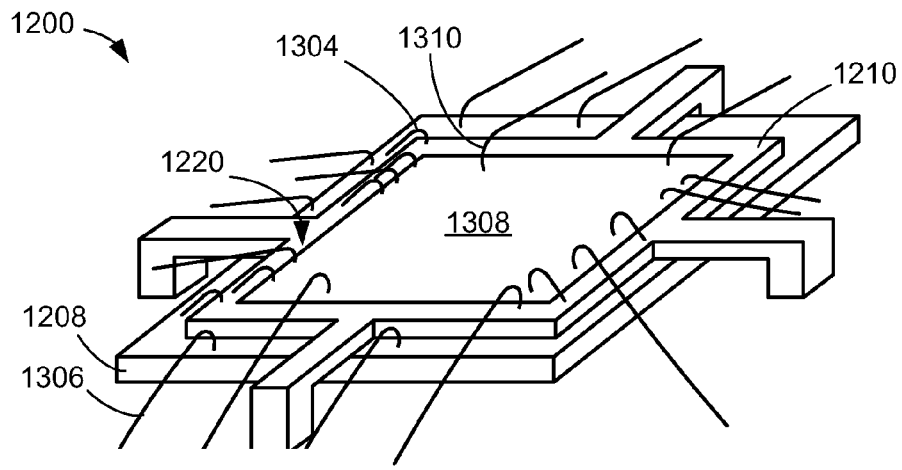
FIG. 13, is an isometric view of a portion of the integrated circuit package system in a connection phase.

Referring now to FIG. 13, therein is shown an isometric view of a portion of the integrated circuit package system 1200 in a connection phase. Only a portion of the integrated circuit package system 1200 is shown for clarity. The integrated circuit package system 1200 preferably includes the top paddle 1210 having the top paddle opening 1220 over the base integrated circuit die 1208.

The base integrated circuit die 1208 can be electrically connected to the top paddle 1210 with first connectors 1304. Second connectors 1306 can also be connected to the base integrated circuit die 1208 for electrically connecting components similar to the leads 1112 of FIG. 11. The first connectors 1304 and the second connectors 1306 can preferably be formed in substantially different directions.

A top integrated circuit die 1308 can be attached or mounted over the base integrated circuit die 1208 and partially in the top paddle opening 1220. The top integrated circuit die 1308 can be electrically connected with top die connectors 1310 such as wire bonds. The top die connectors can connect the top integrated circuit die 1308 to the top paddle 1210 or components similar to the leads 1112 of FIG. 11.

Figure 14:
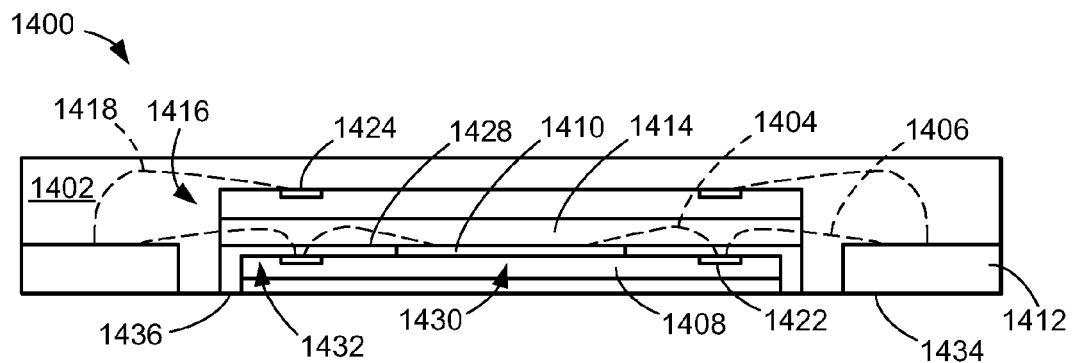
FIG. 14, is an integrated circuit package system in a thirteenth embodiment of the present invention.

Referring now to FIG. 14, therein is shown an integrated circuit package system 1400 in a thirteenth embodiment of the present invention. The integrated circuit package system 1400 preferably includes an encapsulant 1402, first connectors 1404, second connectors 1406, a base integrated circuit die 1408 attached or mounted under a top paddle 1410, and leads 1412.

The first connectors 1404 can be attached to the base integrated circuit die 1408 and the top paddle 1410 in a substantially different direction than the second connectors 1406 attached to the base integrated circuit die 1408 and the leads 1412. The first connectors 1404 or the second connectors 1406 can be formed in a connector layer 1414 with a process such as wire in film (WIF).

A stack device 1416 such as an integrated circuit die can be attached or mounted over the connector layer 1414, the top paddle 1410, and the base integrated circuit die 1408. Stack connectors 1418 can electrically connect the stack device 1416 and the leads 1412 for connectivity to electrical signals or electrical levels.

Electrical connectivity can be provided by base die pads 1422 such as bond pads or die connections for the base integrated circuit die 1408 and stack connection sites 1424 such as bond pads or die connections for the stack device 1416. The first connectors 1404 and the second connectors 1406 can be attached to the base die pads 1422. Similarly, the stack connectors 1418 can be attached to the stack connection sites 1424.

The top paddle 1410 can preferably be formed having planar dimensions smaller than planar dimensions of the base integrated circuit die 1408. Planar dimensions of the top paddle 1410 can be predetermined to provide regions typically having die connections such as a perimeter region substantially exposed for various sizes of the base integrated circuit die 1408.

Optionally, top paddle extensions 1428 can be formed adjacent or connected to the top paddle 1410. The top paddle extensions 1428 can provide improved mounting, locating, positioning, or connectivity for components such as the base integrated circuit die 1408. The top paddle extensions 1428 can also provide electrical connectivity for the top paddle 1410.

The top paddle 1410 can be formed having a top paddle recess 1430 with the base integrated circuit die 1408 attached or mounted partially or fully therein. The top paddle extensions 1428 can also include a recess such as a pad extension recess 1432 for mounting a portion of the base integrated circuit die 1408.

The top paddle recess 1430 and optionally the pad extension recess 1432 can be formed having a depth substantially smaller than a thickness of the leads 1412 and having an opening predetermined to provide spacing for a thickness of the base integrated circuit die 1408. The base integrated circuit die 1408 can optionally be enclosed in the top paddle recess 1430 by the encapsulant 1402.

The encapsulant 1402 can also provide a lead external surface 1434 of the leads 1412 substantially exposed for external electrical connectivity. Exposed portions of the leads 1412 such as the lead external surface 1434 can provide connectivity to a next level system such as another package or a printed circuit board.

Similarly, the encapsulant 1402 can also optionally provide an extension external surface 1436 of the top paddle extensions 1428 substantially exposed for electrical connectivity. Optional exposed portions of the top paddle extensions 1428 such as the extension external surface 1436 can also provide connectivity to a next level system.

Figure 15:
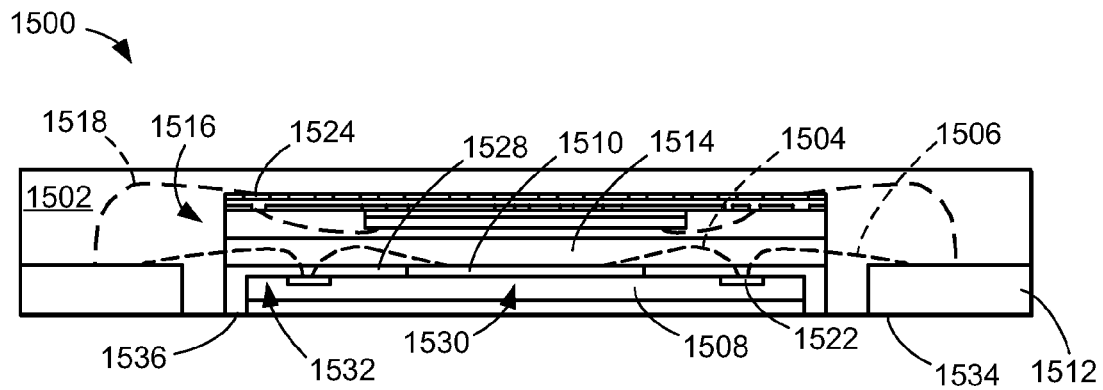
FIG. 15, is an integrated circuit package system in a fourteenth embodiment of the present invention.

Referring now to FIG. 15, therein is shown an integrated circuit package system 1500 in a fourteenth embodiment of the present invention. The integrated circuit package system 1500 preferably includes an encapsulant 1502, first connectors 1504, second connectors 1506, a base integrated circuit die 1508 attached or mounted under a top paddle 1510, and leads 1512.

The first connectors 1504 can be attached to the base integrated circuit die 1508 and the top paddle 1510 in a substantially different direction than the second connectors 1506 attached to the base integrated circuit die 1508 and the leads 1512. The first connectors 1504 or the second connectors 1506 can be formed in a connector layer 1514 with a process such as wire in film.

A stack device 1516 such as an integrated circuit package can be attached or mounted over the connector layer 1514, the top paddle 1510, and the base integrated circuit die 1508. Stack connectors 1518 can electrically connect the stack device 1516 and the leads 1512 for connectivity to electrical signals or electrical levels.

Electrical connectivity can be provided by base die pads 1522 such as bond pads or die connections for the base integrated circuit die 1508 and stack connection sites 1524 such as substrate connections or lands for the stack device 1516. The first connectors 1504 and the second connectors 1506 can be attached to the base die pads 1522. Similarly, the stack connectors 1518 can be attached to the stack connection sites 1524.

The top paddle 1510 can preferably be formed having planar dimensions smaller than planar dimensions of the base integrated circuit die 1508. Planar dimensions of the top paddle 1510 can be predetermined to provide regions typically having die connections such as a perimeter region substantially exposed for various sizes of the base integrated circuit die 1508.

Optionally, top paddle extensions 1528 can be formed adjacent or connected to the top paddle 1510. The top paddle extensions 1528 can provide improved mounting, locating, positioning, or connectivity for components such as the base integrated circuit die 1508. The top paddle extensions 1528 can also provide electrical connectivity for the top paddle 1510.

The top paddle 1510 can be formed having a top paddle recess 1530 with the base integrated circuit die 1508 attached or mounted partially or fully therein. The top paddle extensions 1528 can also include a recess such as a pad extension recess 1532 for mounting a portion of the base integrated circuit die 1508.

The top paddle recess 1530 and optionally the pad extension recess 1532 can be formed having a depth substantially smaller than a thickness of the leads 1512 and having an opening predetermined to provide spacing for a thickness of the base integrated circuit die 1508. The base integrated circuit die 1508 can optionally be enclosed in the top paddle recess 1530 by the encapsulant 1502.

The encapsulant 1502 can also provide a lead external surface 1534 of the leads 1512 substantially exposed for external electrical connectivity. Exposed portions of the leads 1512 such as the lead external surface 1534 can provide connectivity to a next level system such as another package or a printed circuit board.

Similarly, the encapsulant 1502 can also optionally provide an extension external surface 1536 of the top paddle extensions 1528 substantially exposed for electrical connectivity. Optional exposed portions of the top paddle extensions 1528 such as the extension external surface 1536 can also provide connectivity to a next level system.

Figure 16:
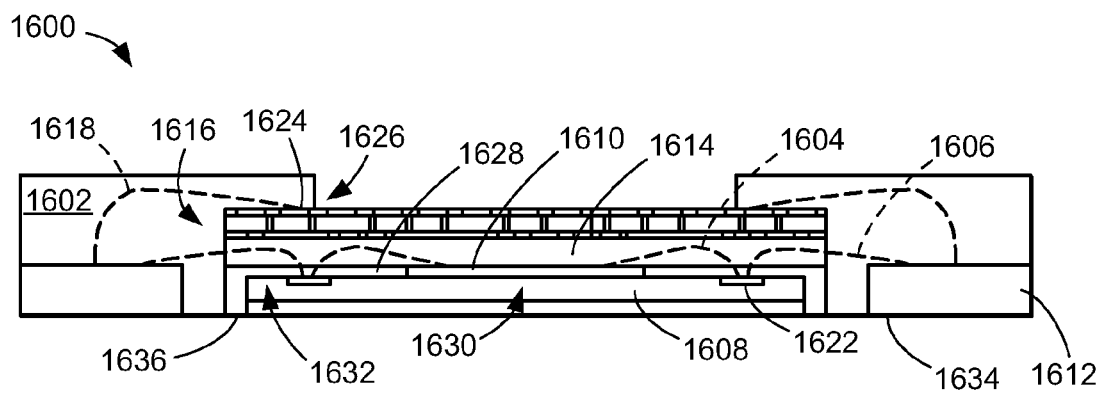
FIG. 16, is an integrated circuit package system in a fifteenth embodiment of the present invention.

Referring now to FIG. 16, therein is shown an integrated circuit package system 1600 in a fifteenth embodiment of the present invention. The integrated circuit package system 1600 preferably includes an encapsulant 1602, first connectors 1604, second connectors 1606, a base integrated circuit die 1608 attached or mounted under a top paddle 1610, and leads 1612.

The first connectors 1604 can be attached to the base integrated circuit die 1608 and the top paddle 1610 in a substantially different direction than the second connectors 1606 attached to the base integrated circuit die 1608 and the leads 1612. The first connectors 1604 or the second connectors 1606 can be formed in a connector layer 1614 with a process such as wire in film.

A stack device 1616 such as an interposer or substrate can be attached or mounted over the connector layer 1614, the top paddle 1610, and the base integrated circuit die 1608. Stack connectors 1618 can electrically connect the stack device 1616 and the leads 1612 for connectivity to electrical signals or electrical levels.

Electrical connectivity can be provided by base die pads 1622 such as bond pads or die connections for the base integrated circuit die 1608 and stack connection sites 1624 such as interposer or substrate connections or lands for the stack device 1616. The first connectors 1604 and the second connectors 1606 can be attached to the base die pads 1622. Similarly, the stack connectors 1618 can be attached to the stack connection sites 1624.

The stack connectors 1618 can also provide electrical connectivity for additional components through an encapsulant cavity 1626 such as a fan-in cavity. The encapsulant cavity 1626 provides a side of the stack device 1616 partially exposed with some of the stack connection sites 1624 substantially exposed. Other components can be electrically connected to the stack connection sites 1624, the stack device 1616, the stack connectors 1618, and the leads 1612, thereby providing connectivity to a next level system.

The top paddle 1610 can preferably be formed having planar dimensions smaller than planar dimensions of the base integrated circuit die 1608. Planar dimensions of the top paddle 1610 can be predetermined to provide regions typically having die connections such as a perimeter region substantially exposed for various sizes of the base integrated circuit die 1608.

Optionally, top paddle extensions 1628 can be formed adjacent or connected to the top paddle 1610. The top paddle extensions 1628 can provide improved mounting, locating, positioning, or connectivity for components such as the base integrated circuit die 1608. The top paddle extensions 1628 can also provide electrical connectivity for the top paddle 1610.

The top paddle 1610 can be formed having a top paddle recess 1630 with the base integrated circuit die 1608 attached or mounted partially or fully therein. The top paddle extensions 1628 can also include a recess such as a pad extension recess 1632 for mounting a portion of the base integrated circuit die 1608.

The top paddle recess 1630 and optionally the pad extension recess 1632 can be formed having a depth substantially smaller than a thickness of the leads 1612 and having an opening predetermined to provide spacing for a thickness of the base integrated circuit die 1608. The base integrated circuit die 1608 can optionally be enclosed in the top paddle recess 1630 by the encapsulant 1602.

The encapsulant 1602 can also provide a lead external surface 1634 of the leads 1612 substantially exposed for external electrical connectivity. Exposed portions of the leads 1612 such as the lead external surface 1634 can provide connectivity to a next level system such as another package or a printed circuit board.

Similarly, the encapsulant 1602 can also optionally provide an extension external surface 1636 of the top paddle extensions 1628 substantially exposed for electrical connectivity. Optional exposed portions of the top paddle extensions 1628 such as the extension external surface 1636 can also provide connectivity to a next level system.

Figure 17:
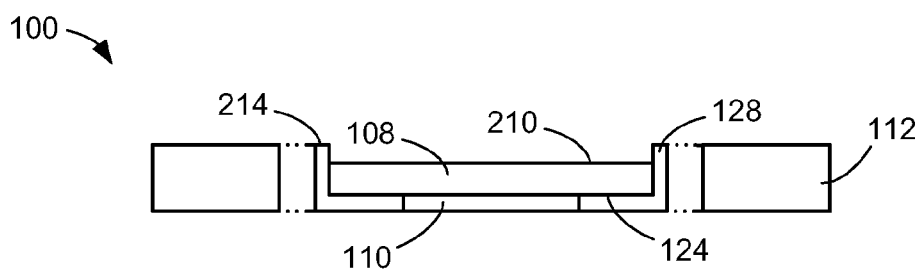
FIG. 17, is the integrated circuit package system in a die attach phase.

Referring now to FIG. 17, therein is shown the integrated circuit package system 100 in a die attach phase. The integrated circuit package system 100 preferably includes the integrated circuit die 108 attached or mounted over the top paddle 110 and adjacent the top paddle extensions 128 and the leads 112.

The die first surface 124 such as an active side or top side can be adjacent the top paddle 110. The die second surface 210 can be near the extension external surface 214 of the top paddle extensions 128 and substantially exposed during processing.

Figure 18:
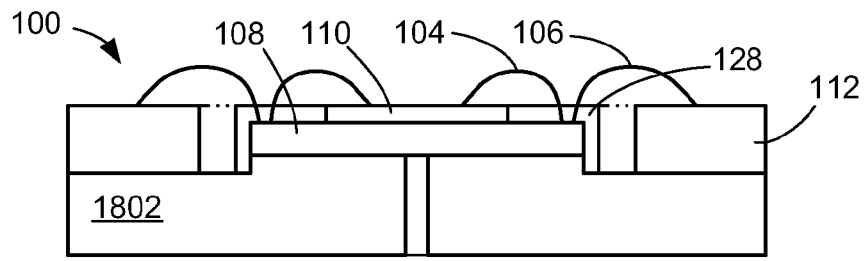
FIG. 18, is the structure of FIG. 17 in a connection phase.

Referring now to FIG. 18, therein is shown the structure of FIG. 17 in a connection phase. The integrated circuit package system 100 preferably includes the integrated circuit die 108 attached or mounted under the top paddle 110 and adjacent the top paddle extensions 128 and the leads 112.

The first connectors 104 can electrically connect the integrated circuit die 108 and the top paddle 110 in a first direction. The second connectors 106 can electrically connect the integrated circuit die 108 and the leads 112 in a second direction.

The first connectors 104 and the second connectors 106 can preferably be formed during one processing phase such as a one pass process optionally including a heater block 1802 providing a vacuum under the integrated circuit die 108 resulting in downward pressure.

Figure 19:
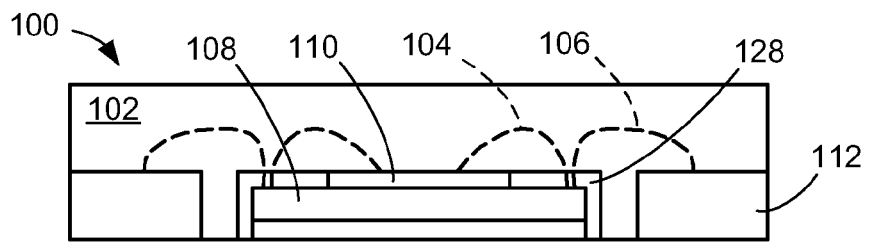
FIG. 19, is an integrated circuit package system in a mold phase.

Referring now to FIG. 19, therein is shown the integrated circuit package system 100 in a mold phase. The integrated circuit package system 100 preferably includes the first connectors 104 connecting the integrated circuit die 108 to the top paddle 110 and the second connectors 106 connecting the integrated circuit die 108 to the leads 112.

The encapsulant 102 can be applied over the first connectors 104, the second connectors 106, the integrated circuit die 108, and the top paddle 110 to cover or protect the components. The encapsulant 102 can also partially cover or protect the top paddle extensions 128 or the leads 112.

Figure 20:
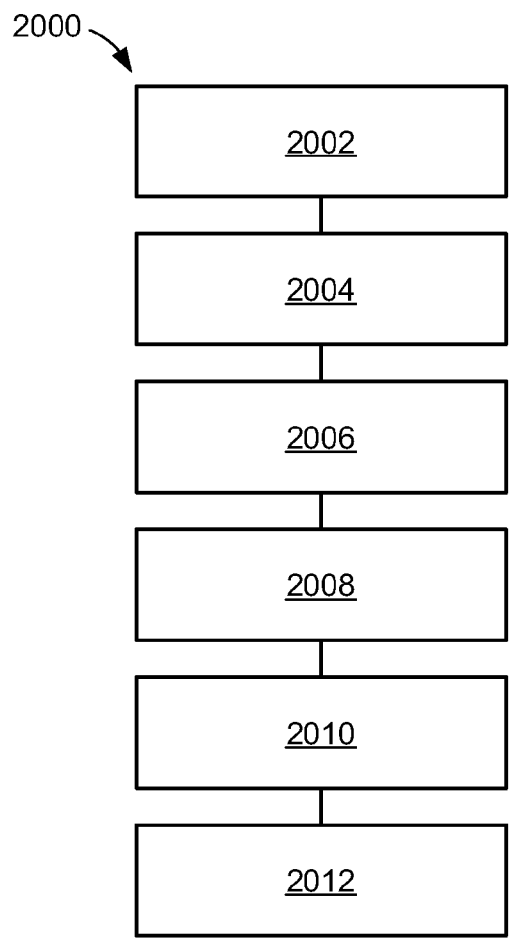
FIG. 20, therein is shown a flow chart of an integrated circuit package system for manufacturing the integrated circuit package system in an embodiment of the present invention.

Referring now to FIG. 20, therein is shown a flow chart of an integrated circuit package system 2000 for manufacturing the integrated circuit package system 100 in an embodiment of the present invention. The system 2000 includes providing an integrated circuit die in a block 2002; forming a top paddle over the integrated circuit die wherein the top paddle has planar dimensions smaller than planar dimensions of the integrated circuit die in a block 2004; forming leads adjacent the top paddle in a block 2006; attaching first connectors to the integrated circuit die and the top paddle in a block 2008; attaching second connectors to the integrated circuit die and the leads in a block 2010; and forming an encapsulant over the first connectors, the second connectors, the integrated circuit die, and the top paddle in a block 2012.

In greater detail, a system to provide the method and apparatus of the integrated circuit package system 100, in an embodiment of the present invention, is performed as follows:

1. Providing an integrated circuit die having die pads.
2. Forming a top paddle over the integrated circuit die wherein the die pads are substantially exposed.
3. Forming leads adjacent a perimeter of the top paddle.
4. Attaching first connectors to the integrated circuit die and the top paddle wherein the first connectors have a first path.
5. Attaching second connectors to the integrated circuit die and the leads wherein the second connectors have a second path substantially different from the first path.
6. Forming an encapsulant over the first connectors, the second connectors, the integrated circuit die, and the top paddle wherein the encapsulant provides the leads partially exposed.

Thus, it has been discovered that the integrated circuit package system method and apparatus of the present invention furnish important and heretofore unknown and unavailable solutions, capabilities, and functional aspects. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. An method of manufacture of an integrated circuit package system comprising:
   providing an integrated circuit die;
   mounting a top paddle over the integrated circuit die wherein the top paddle has planar dimensions smaller than planar dimensions of the integrated circuit die and a top paddle extension having a pad extension recess for mounting the integrated circuit die therein;

forming leads adjacent the top paddle;

attaching first connectors to the integrated circuit die and the top paddle;

attaching second connectors to the integrated circuit die and the leads; and forming an encapsulant over the first connectors, the second connectors, the integrated circuit die, and the top paddle with the top paddle extension exposed.

2. The method as claimed in claim 1 further comprising forming the top paddle having a top paddle recess with a depth substantially smaller than the thickness of the lead.

3. The method as claimed in claim 1 wherein forming the top paddle includes forming a top paddle opening through the top paddle.

4. The method as claimed in claim 1 wherein forming the top paddle includes:
    forming a first top die paddle; and
    forming a second top die paddle adjacent the first top die paddle.

5. The method as claimed in claim 1 further comprising:
    forming a connector layer over the first connectors and the second connectors; and
    attaching a stack device over the connector layer.

6. A method of manufacture of an integrated circuit package system comprising:
    providing an integrated circuit die having die pads;
    mounting a top paddle over the integrated circuit die wherein the die pads are substantially exposed and the top paddle includes a top paddle extension having a pad extension recess for mounting the integrated circuit die therein;
    forming leads adjacent a perimeter of the top paddle;
    attaching first connectors to the integrated circuit die and the top paddle wherein the first connectors have a first path;
    attaching second connectors to the integrated circuit die and the leads wherein the second connectors have a second path substantially different from the first path; and
    forming an encapsulant over the first connectors, the second connectors, the integrated circuit die, and the top paddle wherein the encapsulant provides the leads partially exposed and the top paddle extension exposed.

7. The method as claimed in claim 6 further comprising connecting a die paddle connector to the top paddle or a tie bar attached to the top paddle.

8. The method as claimed in claim 6 further comprising:
    forming a connector layer over the first connectors and the second connectors; and
    attaching a stack device over the connector layer; and
    forming an encapsulant cavity over the stack device.

9. The method as claimed in claim 6 further comprising:
    providing a base substrate;
    attaching a base device over the base substrate; and
    attaching the encapsulant over the base device.

10. The method as claimed in claim 6 further comprising:
    providing a base substrate;
    attaching a base device over the base substrate;
    attaching a stack device over the base device;
    forming a spacer adjacent the stack device and over the base device; and
    attaching the encapsulant over the spacer.

11. An integrated circuit package system comprising:
    an integrated circuit die;
    a top paddle over the integrated circuit die wherein the top paddle has planar dimensions smaller than planar dimensions of the integrated circuit die and the a top paddle extension having a pad extension recess for mounting the integrated circuit die therein;
    leads adjacent the top paddle;
    first connectors to the integrated circuit die and the top paddle;
    second connectors to the integrated circuit die and the leads; and
    an encapsulant over the first connectors, the second connectors, the integrated circuit die, and the top paddle with the top paddle extension exposed.

12. The system as claimed in claim 11 wherein the top paddle has a top paddle recess with a depth substantially smaller than the thickness of the lead.

13. The system as claimed in claim 11 wherein the top paddle includes a top paddle opening through the top paddle.

14. The system as claimed in claim 11 wherein the top paddle includes:
    a first top die paddle; and
    a second top die paddle adjacent the first top die paddle.

15. The system as claimed in claim 11 further comprising:
    a connector layer over the first connectors and the second connectors; and
    a stack device over the connector layer.

16. The system as claimed in claim 11 wherein:
    the integrated circuit die having die pads;
    the top paddle over the integrated circuit die wherein the die pads are substantially exposed;
    the leads adjacent a perimeter of the top paddle;
    the first connectors attached to the integrated circuit die and the top paddle wherein the first connectors have a first path;
    the second connectors attached to the integrated circuit die and the leads wherein the second connectors have a second path substantially different from the first path; and
    the encapsulant over the first connectors, the second connectors, the integrated circuit die, and the top paddle wherein the encapsulant provides the leads partially exposed.

17. The system as claimed in claim 16 further comprising a die paddle connector connected to the top paddle or a tie bar attached to the top paddle.

18. The system as claimed in claim 16 further comprising:
    a connector layer over the first connectors and the second connectors; and
    a stack device over the connector layer; and
    an encapsulant cavity over the stack device.

19. The system as claimed in claim 16 further comprising:
    a base substrate; and
    a base device over the base substrate wherein the encapsulant is over the base device.

20. The system as claimed in claim 16 further comprising:
    a base substrate;
    a base device over the base substrate;
    a stack device over the base device; and
    a spacer adjacent the stack device and over the base device wherein the encapsulant is attached over the spacer.

* * * * *

UNITED STATES PATENT AND TRADEMARK OFFICE
CERTIFICATE OF CORRECTION

| | | |
|---|---|---|
| PATENT NO. | : 7,911,040 B2 | |
| APPLICATION NO. | : 11/965621 | |
| DATED | : March 22, 2011 | |
| INVENTOR(S) | : Tay et al. | |

It is certified that error appears in the above-identified patent and that said Letters Patent is hereby corrected as shown below:

<u>Title page (73) Assignee</u>:
    delete "Sinapore (SG)" and insert therefor --Singapore (SG)--

<u>Column 14</u>:
    line 62, claim 1, delete "An method" and insert therefor --A method--

Signed and Sealed this
Fourteenth Day of June, 2011

David J. Kappos
*Director of the United States Patent and Trademark Office*